US009773613B2

(12) United States Patent
Lee et al.

(10) Patent No.: US 9,773,613 B2
(45) Date of Patent: Sep. 26, 2017

(54) ELECTRONIC DEVICE HAVING CAPACITOR

(71) Applicant: Samsung Electronics Co., Ltd., Suwon-si, Gyeonggi-do (KR)

(72) Inventors: Joonsoo Lee, Busan (KR); Myungjae Jo, Gumi-si (KR); Chulhyung Yang, Gumi-si (KR); Jiwoo Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/139,867

(22) Filed: Apr. 27, 2016

(65) Prior Publication Data

US 2016/0360015 A1    Dec. 8, 2016

(30) Foreign Application Priority Data

Jun. 4, 2015 (KR) ........................ 10-2015-0079280

(51) Int. Cl.
    *H01G 4/005* (2006.01)
    *H01Q 1/24* (2006.01)
    *H01G 4/06* (2006.01)

(52) U.S. Cl.
    CPC .............. *H01G 4/005* (2013.01); *H01G 4/06* (2013.01); *H01Q 1/243* (2013.01)

(58) Field of Classification Search
    CPC ...... H01G 4/005; H02G 4/006; G06F 3/0202; G06F 3/0213
    See application file for complete search history.

(56) References Cited

U.S. PATENT DOCUMENTS

| 4,027,569 A | * | 6/1977 | Luce ................... | G10H 1/0551 341/33 |
| 2004/0095151 A1 | * | 5/2004 | Schmidt ............... | G01D 5/2405 324/686 |
| 2011/0180312 A1 | * | 7/2011 | Kim ..................... | H05K 1/0231 174/260 |
| 2014/0003012 A1 | | 1/2014 | Lee et al. | |
| 2014/0036116 A1 | * | 2/2014 | Peng ..................... | H04N 5/335 348/294 |

FOREIGN PATENT DOCUMENTS

KR    10-1472628 B1    1/2014

* cited by examiner

*Primary Examiner* — Tuan Pham
(74) *Attorney, Agent, or Firm* — Jefferson IP Law, LLP

(57) ABSTRACT

An electronic device is provided. The electronic device includes a housing, an antenna radiating body including a conductive metal, a first member disposed within the housing and electrically connected to the antenna radiating body, a printed circuit board (PCB) disposed within the housing, a flexible connecting member disposed between at least a portion of the first member and at least a portion of a second member and including a conductive material, and a capacitor including a first conductive plate that contacts the second member or formed by a portion of the second member, a second conductive plate, separated from the first conductive plate and electrically connected to the PCB, and a dielectric layer inserted between the first conductive plate and the second conductive plate.

7 Claims, 9 Drawing Sheets

ELECTRONIC DEVICE HAVING CAPACITOR

CROSS-REFERENCE TO RELATED APPLICATION(S)

This application claims the benefit under 35 U.S.C. §119 (a) of a Korean patent application filed on Jun. 4, 2015 in the Korean Intellectual Property Office and assigned Serial number 10-2015-0079280, the entire disclosure of which is hereby incorporated by reference.

TECHNICAL FIELD

The present disclosure relates to a coupling structure of a capacitor within an electronic device having the capacitor.

BACKGROUND

In order to provide various wireless communication functions, electronic devices may have at least one antenna. For example, electronic devices may have a mobile communication antenna, digital broadcasting receiving antenna, Bluetooth antenna, global positioning system (GPS) antenna, or near field communication (NFC) antenna.

Electronic devices having such an antenna have been launched in various forms including those having a metal case. For example, such an electronic device may include a cover or a circumferential edge formed by a metal case. In this case, the metal case may also operate as an antenna. That is, the metal case may transmit and receive a wireless signal, as in an antenna.

Demand for such electronic devices having a metal case has increased. However, because an electronic device having a metal case has a structure that exposes metal to the outside, danger of an electric shock always exists. In order to prevent an electric shock, the electronic device may have a capacitor electrically coupled between a printed circuit board (PCB) and the metal case. For example, the electronic device may have a capacitor at a location adjacent to that of a C-type clip (hereinafter, C-clip) that connects the metal case and the PCB for preventing an electric shock from occurring. As another example, the electronic device may have a capacitor in an upper portion or surface of the PCB that connects the metal case and the PCB for preventing an electric shock from occurring.

However, as the capacitor is provided at a location adjacent to that of a C-clip, an electronic device of the related art has a disadvantageous space usage problem (i.e., waste of space), specifically, in securing a space on the PCB for the capacitor. Further, even if the electronic device of the related art has a capacitor in an upper portion or surface of the PCB, a difference between capacitance may be large according to a peripheral ground (GND) and thus, a problem occurs where radio frequency (RF) performance becomes unstable.

The above information is presented as background information only, and to assist with an understanding of the present disclosure. No determination has been made, and no assertion is made, as to whether any of the above might be applicable as prior art with regard to the present disclosure.

SUMMARY

Aspects of the present disclosure are provided to address at least the above-mentioned problems and/or disadvantages, and to provide at least the advantages described below. Accordingly, an aspect of the present disclosure is to provide an electronic device that can effectively secure a mounting space therein and that can stabilize a radio frequency (RF) performance while removing an electric shock factor.

In accordance with an aspect of the present disclosure, an electronic device is provided. The electronic device includes a housing, an antenna radiating body including a conductive metal, a first member disposed within the housing and electrically connected to the antenna radiating body, a printed circuit board (PCB) disposed within the housing, a flexible connecting member disposed between at least a portion of the first member and at least a portion of the second member and including a conductive material, and a capacitor including a first conductive plate that contacts the second member or formed by a portion of the second member, a second conductive plate separated from the first conductive plate, and a dielectric layer inserted between the first conductive plate and the second conductive plate. The first member and/or the second member may be formed of a metal material and/or various other conductive materials.

In accordance with another aspect of the present disclosure, an electronic device is provided. The electronic device includes a housing including a metal material portion, a first conductive member that contacts at least a portion of the metal material portion, or that is formed by the metal material portion, a second conductive member separated from the first conductive member, and a capacitor disposed between the first conductive member and the second conductive member.

In accordance with another aspect of the present disclosure, an electronic device is provided. The electronic device includes a flexible connecting member including a conductive material and a capacitor including a first conductive member including a plurality of first conductive plates connected to at least a portion of a lower end or surface of the flexible connecting member, or that replace at least a portion of the flexible connecting member, and that are separated by a predetermined gap at each side surface from adjacent first conductive plates, a second conductive member including a plurality of second conductive plates that are interdigitated with the plurality of first conductive plates and separated by a predetermined gap at each side surface from adjacent second conductive plates, and a dielectric layer inserted between the first conductive member and the second conductive member.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
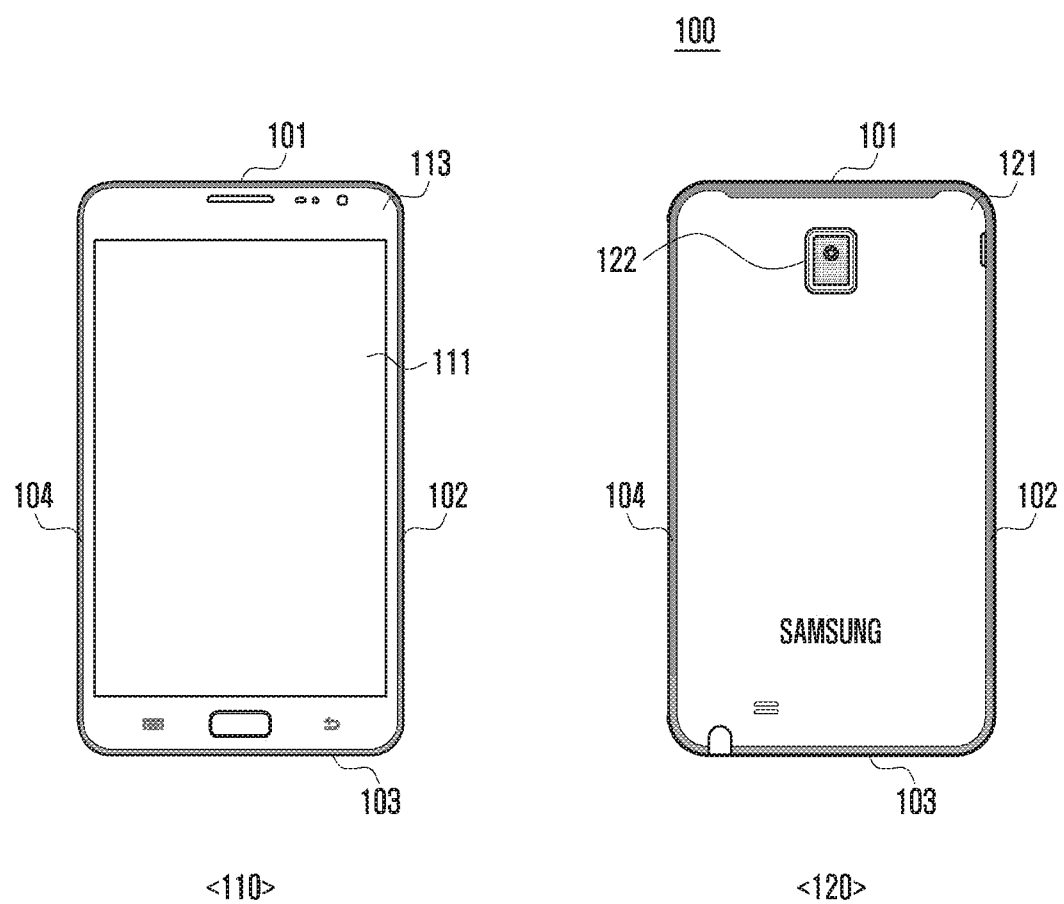
FIG. 1 is a block diagram illustrating a configuration of an electronic device according to various embodiments of the present disclosure.

The following description with reference to the accompanying drawings is provided to assist in a comprehensive understanding of various embodiments of the present disclosure as defined by the claims and their equivalent. It includes various specific details to assist in that understanding, but these are to be regarded as merely exemplary. Accordingly, those of ordinary skill in the art will recognize that various changes and modifications of the various embodiments described herein can be made without departing from the spirit and scope of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only, and not for the purpose of limiting the present disclosure as defined by the appended claims and their equivalents.

It is to be understood that the singular forms "a", "an", and "the", include plural referents unless the context clearly dictates otherwise. Thus, for example, reference to "a component surface" includes reference to one or more of such surfaces.

An expression "comprising", "may comprise", "comprises", and "comprising" used in the present disclosure indicates a presence of a corresponding function, operation, element, or presence of a characteristic, numeral, operation, element, component, or combination thereof described in the specification, and does not limit additional functions, operations, and presence of characteristics, numerals, operations, elements, components, or combinations thereof described in the specification. In the present disclosure, an expression "or" includes any combination or the entire combination of together listed words. An expression of "a first" and "a second" in the present disclosure may represent various elements of the present disclosure, but does not limit corresponding elements. For example, the expression "a first" and "a second" in the present disclosure does not limit an order and/or importance of corresponding elements. The expression may be used for simply distinguishing one element from another element. For example, both a first user device and a second user device are user devices, but represent different user devices. As further example, a first constituent element may be referred to as a second constituent element without deviating from the scope of the present disclosure, and similarly, a second constituent element may be referred to as a first constituent element.

When it is described that an element is "coupled" to another element, the element may be "directly coupled" electrically or physically to the other element, or "electrically coupled" to the other element through a third element. However, when it is described that an element is "directly coupled" to another element, no element may exist between the element and the other element.

Terms used in the present disclosure are provided not to limit the present disclosure, but to illustrate various embodiments. When used in a description of the present disclosure and the appended claims, a singular form includes a plurality of forms unless it is explicitly defined differently.

Unless differently defined, entire terms including technical terms and scientific terms used herein have the same meaning as a meaning that may be generally understood by a person of ordinary skill in the art. It should be understood that generally used terms defined in a dictionary have a meaning corresponding to that of a context of related technology, and are not to be understood as having an ideal or excessively formal meaning unless explicitly defined differently.

In this disclosure, an electronic device may be a device that includes or otherwise provides a communication function. For example, an electronic device may be a smart phone, tablet personal computer (PC), mobile phone, video phone, e-book reader, desktop PC, laptop PC, netbook computer, personal digital assistant (PDA), portable multimedia player (PMP), Moving Picture Experts Group phase 1 or phase 2 (MPEG-1 or MPEG-2) audio layer 3 (MP3) player, portable medical device, digital camera, or wearable device (e.g., a head-mounted device (HMD) such as electronic glasses, electronic clothes, electronic bracelet, electronic necklace, electronic appcessory, or smart watch), but embodiments are not limited thereto.

According to some embodiments of the present disclosure, an electronic device may include a smart home appliance that includes or otherwise provides a communication function. For example, such an electronic device may be a television (TV), digital versatile disc (DVD) player, audio equipment, refrigerator, air conditioner, vacuum cleaner, oven, microwave, washing machine, air cleaner, set-top box, TV box (e.g., Samsung HomeSync™, Apple TV™, Google TV™, and the like), game console, electronic dictionary, electronic key, camcorder, or electronic picture frame, but embodiments are not limited thereto.

According to some embodiments, such an electronic device may be a medical device (e.g., magnetic resonance angiography (MRA), magnetic resonance imaging (MRI), computed tomography (CT), ultrasonography, and the like), navigation device, global positioning system (GPS) receiver, event data recorder (EDR), flight data recorder (FDR), car infotainment device, electronic equipment for ships (e.g., a marine navigation system, gyrocompass, and the like), avionics, security equipment, or an industrial or home robot, but embodiments are not limited thereto.

According to some embodiments of the present disclosure, such an electronic device may be furniture, or part of a building, office or home, or a construction having a communication function, an electronic board, electronic signature receiving device, projector, or various measuring instruments (e.g., a water meter, electric meter, gas meter, wave meter, and the like). An electronic device disclosed herein may be any one of the above-mentioned devices or any combination thereof, but embodiments are not limited thereto.

A 'capacitor' used in the present disclosure is a device that temporarily stores electricity. A capacitor may also prevent an electric shock of a user. Such a capacitor may occupy a mounting space within an electronic device or, alternatively, a capacitor may be integrated in some form, with the mounting space within an electronic device. According to an embodiment of the present disclosure, a capacitor may be formed as a structure by inserting a dielectric layer (i.e., nonconductor) in which electricity does not flow or partially flows between two conductive plates. The two conductive plates may each be formed with one external electrode and a plurality of internal electrodes. One end of the plurality of the internal electrodes may be connected to the external electrode with a constant gap between the respective adjacent internal electrodes. A description of capacitor functions known to those skilled in the art will be omitted.

FIG. 1 is a block diagram illustrating a configuration of an electronic device according to various embodiments of the present disclosure.

Referring to FIG. 1, an electronic device 100 includes a front surface 110, a rear surface 120, and circumferential edge areas 101, 102, 103, and 104. The front surface 110 of the electronic device 100 may include a display 111 and a bezel 113. According to embodiments of the present disclosure, the display 111 may include both a display panel and a touch panel, and may be implemented by mounting the touch panel on the display panel. An area of the display 111 is not limited to the display area shown in FIG. 1. In some embodiments of the present disclosure, the bezel 113 may be omitted or provided in a different shape or configuration.

According to various embodiments of the present disclosure, at the rear surface 120 of the electronic device 100, a camera 122 may be mounted.

Also at the rear surface 120 of the electronic device, a cover 121 of the electronic device may be provided, where the cover 121 is made of a metal material, which is a conductive material. A form of the cover 121 of the electronic device is not limited to the form shown in FIG. 1, and an entire area or a partial area of the rear surface 120 of the electronic device may be provided with a metal cover.

At least one of the circumferential edge areas 101, 102, 103, and 104 of the electronic device may also be made of a metal or conductive material.

The electronic device 100 may use at least one of the cover 121 or the circumferential edge areas 101, 102, 103, and 104 made of a metal material as an antenna. In the following description, the cover 121 and the circumferential edge areas 101, 102, 103, and 104 made of a metal are referred to as a "metal case".

In an embodiment of the present disclosure, in order to prevent an electric shock or a differential charge potential between the metal case and a printed circuit board (PCB) within the electronic device 100, the electronic device 100 may include a connecting member between the metal case and the PCB within the electronic device 100. The connecting member may also be coupled to a capacitor as described in greater detail below.

According to an embodiment of the present disclosure, the electronic device 100 may include other elements that are not shown in FIG. 1. For example, the electronic device 100 may include a storage unit, controller, radio frequency (RF) unit, and sensor unit as other elements. Functions of the other elements may be performed through hardware, software, or firmware as known to those skilled in the art, and additional details thereof are omitted.

Figure 2:
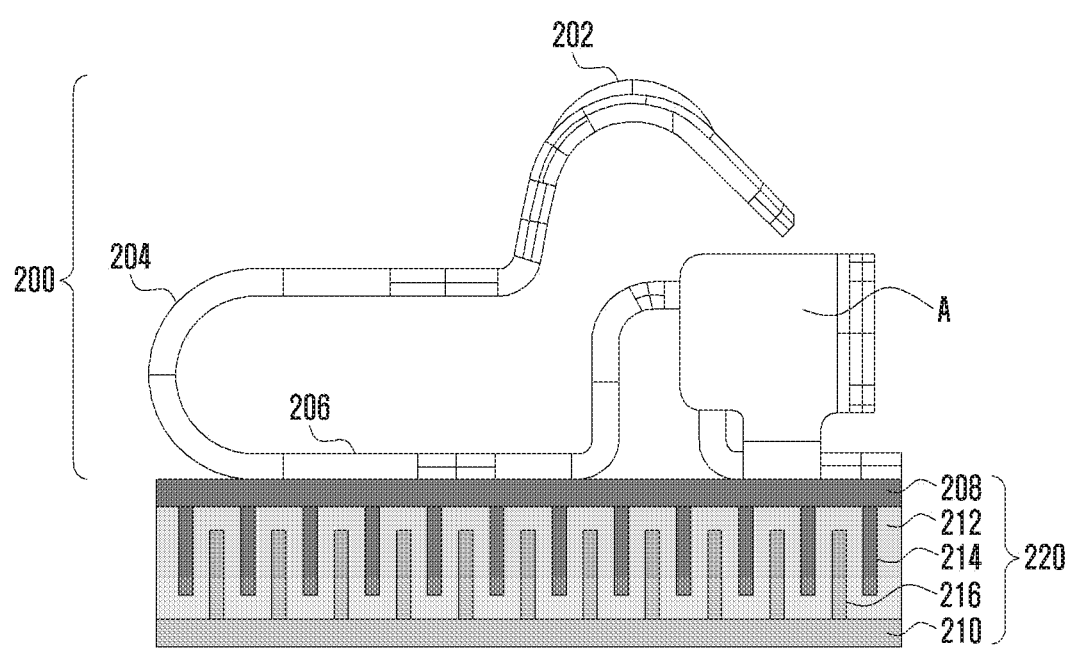
FIGS. 2 and 3 are diagrams illustrating an example of a coupling structure of a capacitor according to various embodiments of the present disclosure.

FIG. 2 is a diagram illustrating an example of a coupling structure of a capacitor according to an embodiment of the present disclosure.

Referring to FIG. 2, a capacitor may be coupled to a connecting member that connects a metal case and a PCB.

According to an embodiment of the present disclosure, a connecting member 200 coupled to a capacitor 220 may be a clip-type member, but embodiments are not limited thereto. Any number of mechanical connecting members can be used. The clip-type member of FIG. 2 is a C-clip having a C-shape, but a clip-type member according to various embodiments of the present disclosure is not limited to such a shape and various forms of clip-type members may be used. A partial area or an entire area of one side surface of the connecting member 200 may contact the metal case to thereby be electrically connected to the metal case, and a partial area or an entire area of another side surface of the connecting member 200 may be coupled to the capacitor 220.

Although not shown in FIG. 2, a metal case is disposed at an upper portion or surface of the connecting member 200 and contacts the connecting member to be electrically connected to the connecting member 200 when the metal case is assembled with the device.

The metal case contacting one side surface of the connecting member 200 includes an antenna radiating body and may thus operate as an antenna. The antenna radiating body may include a metallic member electrically connected to the antenna radiating body at the inside of the metal case. The metallic member may be made of a metal or other conductive material. The metal case then operates as an antenna to transmit and receive a wireless signal.

The device may further include a communication integrated circuit therein. The antenna radiating body may be connected to the communication integrated circuit through at least one of the metal case, connecting member, capacitor, and PCB.

According to an embodiment of the present disclosure, the capacitor 220 is separated from one side surface of the connecting member 200, and is coupled to an opposite side surface of the connecting member 200, and includes two physically insulated conductive materials and a dielectric layer 212 formed between the two conductive materials. The conductive material includes a first external electrode 208 and a second external electrode 210. The first external electrode 208 and the second external electrode 210 may include first internal electrodes 214 and second internal electrodes 216, respectively, arranged in an interdigitated manner. The first internal electrode 214 and the second internal electrode 216 may be a conductive material.

According to an embodiment of the present disclosure, one end of each first internal electrode 214 may be connected to the first external electrode 208, and the other end of each first internal electrode 214 may extend from the first external electrode 208 in a perpendicular manner. When one end of each first internal electrode 214 is connected to the first external electrode 208, the first internal electrodes 214 may be connected with the first external electrode 208 and separated at each side surface from adjacent first internal electrodes 214 at a predetermined distance.

One end of each second internal electrode 216 may be connected to the second external electrode 210, and the other end of each second internal electrode 216 may extend from the second external electrode 210 in a perpendicular manner. When one end of each second internal electrode 216 is connected to the second external electrode 210, the second internal electrodes 216 may be connected with the second external electrode 210 and separated at each side surface from adjacent second internal electrodes 216 at a predetermined distance.

According to an embodiment of the present disclosure, the dielectric layer 212 formed between the conductive materials 208, 210, 214 and 216, may include a nonconductive material in which a current does not flow or flows in a limited or controlled manner. A shape, composition and kind of the dielectric layer 212 is not limited to any one specific embodiment, and capacitance may be changed according to a kind thereof. Because the dielectric layer 212 is a non-conductive material, a current may not flow between the first external electrode 208 and the second external electrode 210 through the dielectric layer 212. Likewise, a current may not flow between the first internal electrode 214 and the second internal electrode 216.

Capacitance of the capacitor 220 is obtained as the dielectric layer 212 is formed between the first external electrode 208 and the second external electrode 210. Capacitance may be a ratio of electric charges accumulated when a voltage is applied across the first external electrode 208 and the second external electrode 210.

Capacitance of the first external electrode 208 may be the same as the sum of capacitance of a plurality of the first internal electrodes 214. Capacitance of the second external electrode 210 may be the same as the sum of capacitance of a plurality of the second internal electrodes 216. Accordingly, the capacitance of the first external electrode 208 is the same as the sum of capacitance of the plurality of first internal electrodes 214, and the capacitance of the second external electrode 210 is the same as the sum of capacitance of the plurality of second internal electrodes 216.

Capacitance of such a capacitor may change according to the number of internal electrodes 214 and 216 formed in plural. Specifically, capacitance may be proportional to an area of an internal electrode of the capacitor and may be inversely proportional to an insulated distance of the conductive material.

A partial area or an entire area of the first external electrode 208 constituting the capacitor 220 may be coupled to the connecting member 200 to communicate a current. The first external electrode 208 may be formed at one side of the capacitor 220, and may be coupled to the connecting member 200 in a number of ways to communicate a current.

A partial area or an entire area of the second external electrode 210, which is another external electrode constituting the capacitor 220, may be coupled and connected to a PCB ground terminal (hereinafter, PCB GND) to communicate a current. In order to prevent an electric shock from occurring, a current communicated from the connecting member 200 may be grounded to the PCB GND through the capacitor 220. The partial area or the entire area thereof may be coupled and connected to a surface-mount device GND (hereinafter, SMD GND) in addition to the PCB GND. The second external electrode 210 may be formed at the other side of the first external electrode 208 of the capacitor 220.

The capacitor 220 is described as an example of an interdigitated capacitor according to various embodiments of the present disclosure, but capacitors of other various structures and configurations may be used. Any form of capacitor as an element having capacitance may be used in the present disclosure.

The connecting member 200 may include the C-clip form of FIG. 2, but embodiments are not limited thereto. The connecting member 200 includes a contact portion 202, a bending portion 204, and a support portion 206.

The connecting member 200 may include a metal or conductive material. For example, an SMD gasket may be used as the connecting member 200. The SMD gasket may have an elasticity to elastically bias the contact portion 202 toward the metal case, and include a conductive material. For example, the SMD gasket may be disposed between conductive materials of the connecting member 200 to connect the conductive materials.

In an embodiment of the present disclosure, the SMD gasket and conductive materials may electrically connect a partial area or an entire area of the metal case and a partial area or an entire area of the capacitor 220. The SMD gasket and conductive materials may enable a current to flow between the metal case and the capacitor 220 connected to the PCB. A detailed description thereof will now be described.

In order to use the metal case as an antenna, the contact portion 202 may contact the metal case. In FIG. 2, the contact portion 202 is formed as one curved surface, however embodiments are not limited thereto. For example, because at least one surface is formed in a bending surface, a point contacting the metal case may become the contact portion 202.

Alternatively, in an embodiment of the present disclosure, if the contact portion 202 is bent in an angular form as well as a softly bent curved surface, a flat surface may be used to contact the metal case.

Alternatively, in an embodiment of the present disclosure, if the contact portion 202 is bent to form an angle, an acute surface may be used to contact the metal case.

Alternatively, in an embodiment of the present disclosure, in the contact portion 202, a surface formed as a flat surface may be used to contact the metal case.

According to an embodiment of the present disclosure, the bending portion 204 may include a softly bent form of a material having elasticity in order for the metal case and the connecting member 200 of FIG. 2 to always maintain a contact state, but a form of the bending portion 204 is not limited thereto. For example, in FIG. 2, the bending portion 204 is implemented at a left side, but the bending portion 204 may be implemented at a right side, and the bending portion 204 may be implemented in various forms such as a leaf spring or coil spring.

According to an embodiment of the present disclosure, the support portion 206 of connecting member 200 may be electrically connected to the metal case by the bending portion 204.

According to an embodiment of the present disclosure, in order to couple the support portion 206 to the capacitor 220, the support portion 206 may include a flat lower surface. As the connecting member 200 and the capacitor 220 are coupled via contact with the flat lower surface of the support portion 206, the support portion 206 may be used as a path in which current flows from the contact portion 202 and the bending portion 204 to the first external electrode 208 of the capacitor 220. The support portion 206 may include at least one bending area.

According to an embodiment of the present disclosure, although not shown, a bonding member may be formed between the connecting member 200 and the capacitor 220. Specifically, a bonding member may be formed between the support portion 206 of the connecting member 200, and the first external electrode 208 of the capacitor 220. The connecting member 200 and the capacitor 220 may be electrically connected through the bonding member. The bonding member may be used as a path in which current flows from the contact portion 202, bending portion 204 and support portion 206 to a point of the first external electrode 208 of the capacitor 220.

According to an embodiment of the present disclosure, the capacitor 220 may also be coupled to a lower end of the connecting member 200 via support A. The support A may be used as a path in which current flows from the contact portion 202, bending portion 204 and support portion 206 to a lower end of the first external electrode 208 of the capacitor 220.

According to an embodiment of the present disclosure, the capacitor 220 may be coupled to the connecting member 200. As the connecting member 200 coupled to the capacitor 220 has elasticity, the connecting member 200 and the metal case may maintain a contact state, such that the capacitor 220 may be coupled to the metal case.

The metal case may include an antenna radiating body that transmits and receives a wireless signal. The antenna radiating body may be mounted within the metal case or in close contact and be bonded to the metal case. A partial area or an entire area of the connecting member 200 may maintain a contact state with the metal case. One side surface of the capacitor 220 may be coupled to the connecting member 200, and the other side surface thereof may be coupled to the PCB. Since the capacitor 220 is coupled to the connecting member 200 in an upper portion or surface of the PCB, the capacitor 220 may not require a separate mounting space. Further, since the capacitor 220 directs a current from the metal case to the PCB GND, danger of an electric shock can be prevented. Still further, since the capacitor 220 is coupled to the connecting member 200, RF noise can also be minimized regardless of a capacity change of the capacitor 220.

Figure 3:
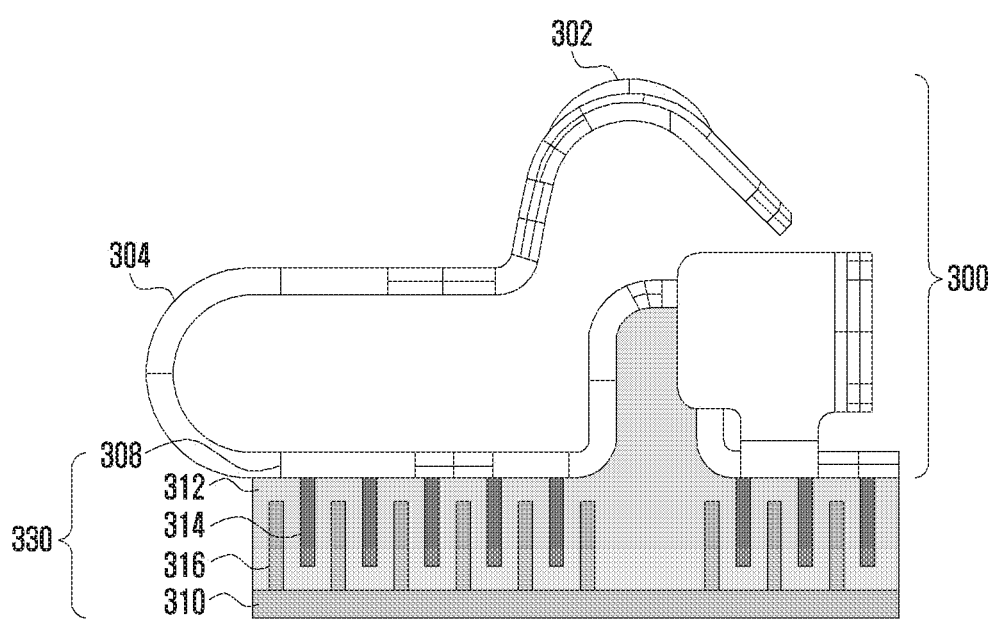

FIG. 3 is a diagram illustrating another example of a coupling structure of a capacitor according to an embodiment of the present disclosure.

Referring to FIG. 3, a capacitor 330 may be integrally formed with a connecting member 300 that connects a metal case and a PCB at a production operation or may be integrally formed through soldering.

In an embodiment of the present disclosure, one side surface of the connecting member 300 may entirely or partially replace an external electrode of the capacitor 330. As shown in FIG. 3, a support portion 308 of the connecting member 300 may be constructed as an external electrode included in the capacitor 330.

The remaining elements 302, 304, 310, 312, 314 and 316 are substantially the same as corresponding elements 202, 204, 210, 212, 214 and 216 of FIG. 2 and therefore, detailed descriptions thereof will be omitted.

Figure 4:
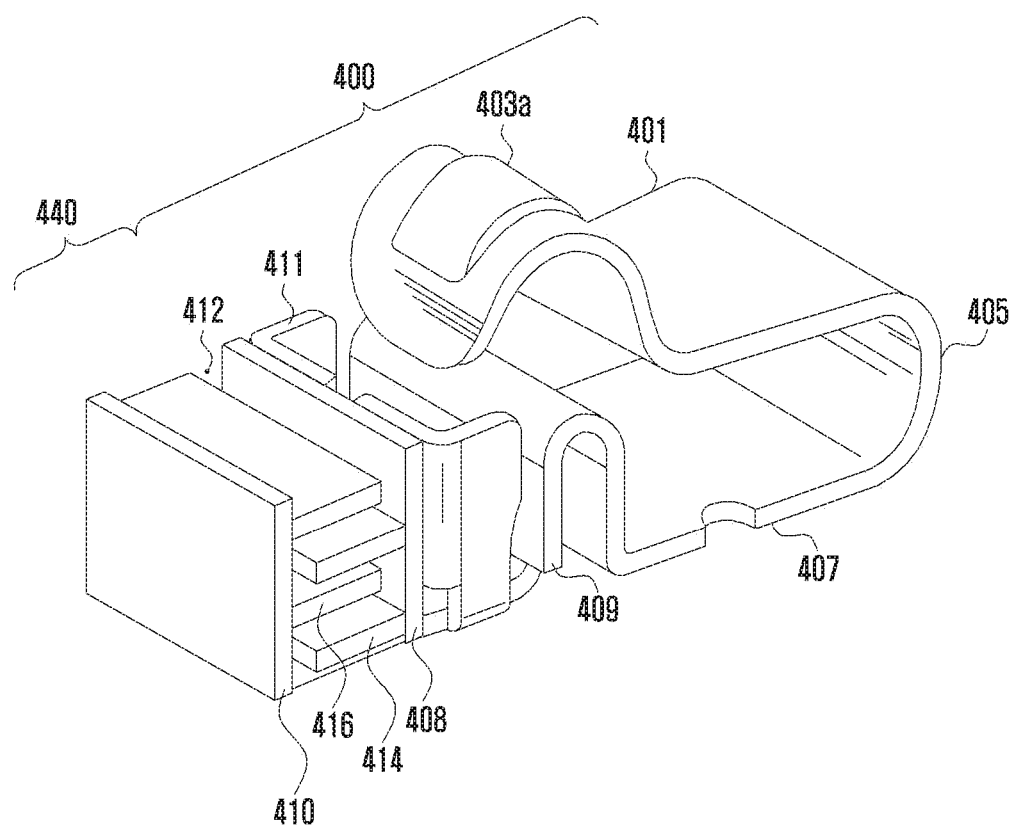
FIG. 4 is a perspective view illustrating an example of a connecting member according to an embodiment of the present disclosure.

FIG. 4 is a perspective view illustrating a structure of a connecting member according to various embodiments of the present disclosure.

Referring to FIG. 4, an example of a connecting member 400 that connects a metal case and a PCB is described. The connecting member 400 includes a contact portion 401, a bending portion 405, a side surface 411, and a support unit 407.

In the following embodiment of the present disclosure, one side surface of the connecting member 400 may be coupled to a capacitor 440. When the connecting member 400 and one side surface of the capacitor 440 are coupled, the connecting member 400 may not be limited to coupling to one side surface of the capacitor 440. For example, the contact portion 401, side surface 411, and support unit 407 of the connecting member 400 may be coupled to the capacitor 440. However, since the capacitor 440 is coupled at a side surface 411 of the connecting member 400, the support surface 407 of the connecting member may be coupled to any other flat surface, such as a PCB surface. The capacitor 440 may then be coupled to the other flat surface at a same level at which the connecting member 400 may be coupled.

As shown in FIG. 4, the side surface 411 of the connecting member 400 and the capacitor 440 may be connected. The capacitor 440 may include a first external electrode 408, a second external electrode 410, a dielectric layer 412, a first internal electrode 414, and a second internal electrode 416. The elements 408, 410, 412, 414 and 416 are substantially the same as corresponding elements 208, 210, 212, 214 and 216 of FIG. 2 and therefore, detailed descriptions thereof will be omitted. The side surface 411 of the connecting member 400 and the first external electrode 408 of the capacitor 440 may contact and be electrically connected as described above. For example, according to various embodiments of the present disclosure, the side surface 411 of the connecting member 400 may replace the first external electrode 408 substantially as described above in regard to FIG. 3.

As shown in FIG. 4, the contact portion 401 of the connecting member 400 may include a bending area 403a that is bent to elastically contact the metal case. A mostly convex area of the bending area 403a may contact the metal case. In FIG. 4, one bending area 403a is described, but the number of bending areas is not limited thereto. For example, a plurality of convex areas may be formed in the one bending area or in a plurality of bending areas in the case where at least two bending areas are formed that may contact the metal case.

According to various embodiments of the present disclosure, the contact portion 401 of the connecting member 400 may not include the bending area 403a. For example, the contact portion 401 of the connecting member 400 may be formed with a flat surface, and a partial area or an entire area of the flat surface may elastically contact the metal case.

The support unit 407 of the connecting member 400 may include another bending area 409. When the side surface 411 (e.g., a side surface of the connecting member) of the bending area 409 has a flat surface that may contact the capacitor 440, the capacitor 440 may contact the side surface 411 (i.e., side surface of the connecting member) of the connecting member 400. That is, the capacitor 440 may contact a surface that is not limited to the connecting member 400.

In an embodiment of the present disclosure, in order for the contact portion 401 to contact a metal case, the contact portion 401 may include an angular area (e.g., angle of 180° or less). The angular area (e.g., the bending area 403a) may contact the metal case.

In an embodiment of the present disclosure, in order for the contact portion 401 to contact a metal case, two or more angular areas may include one or more surfaces. In the contact portion 401, as a surface is formed through two angles, a partial area of the contact portion 401 may contact the metal case.

One angular area is illustrated is FIG. 4, but the number of angular areas is not limited thereto, and if at least two or more angular areas are formed, a mostly convex area or areas of the plurality of bending areas may contact the metal case.

Figure 5:
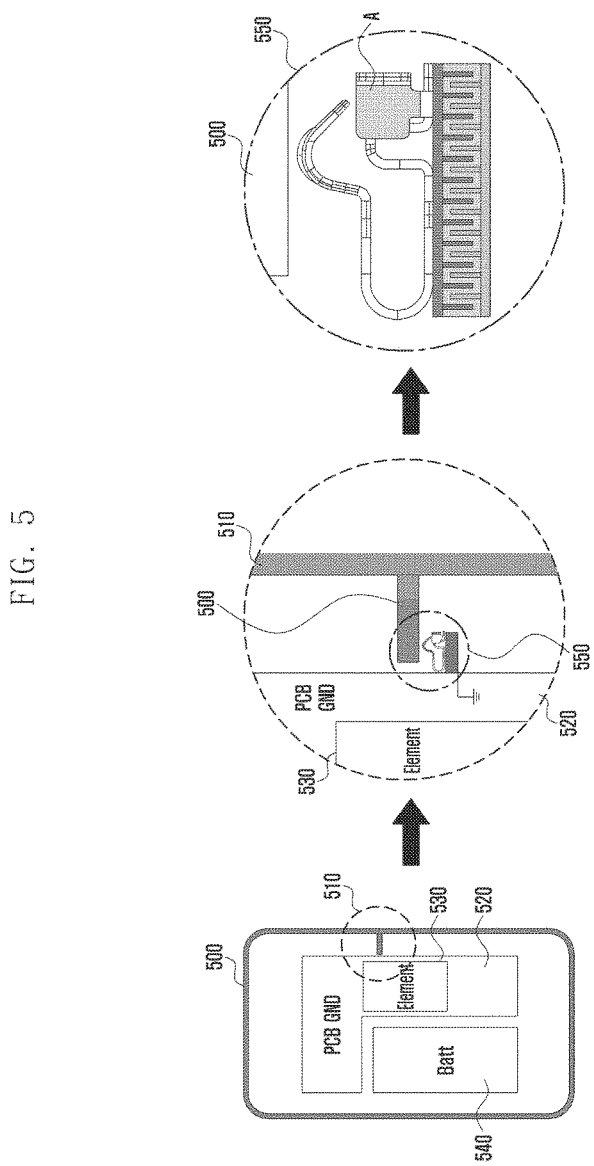
FIG. 5 is a diagram illustrating an example of a coupling structure of a capacitor according to an embodiment of the present disclosure.

FIG. 5 is a diagram illustrating an example of a coupling structure of a capacitor according to an embodiment of the present disclosure.

Referring to FIG. 5, the electronic device includes a metal case 500. The metal case 500 may include an antenna radiating body mounted therein or coupled to the inside thereof. The electronic device may transmit and receive a wireless signal through the antenna radiating body. The metal case 500 may include a battery 540 and a PCB 520 therein and may further include other elements as known to those skilled in the art and as such, detailed descriptions thereof will be omitted.

In order to execute functions of the electronic device, the PCB 520 may include at least one element 530 thereon, such as a processor, controller, memory and the like.

In an embodiment of the present disclosure, a capacitor may be formed between the metal case 500 and the PCB 520. The capacitor may be coupled to a connecting member at a lower end of the connecting member. The connecting member coupled to the capacitor may be coupled in an interposed manner between the metal case 500 and the PCB 520.

In an embodiment of the present disclosure, in order to connect the metal case 500 and the PCB 520, the capacitor may be formed at a side surface of the connecting member. Referring to an enlarged illustration portion 510 in which the metal case 500 and the connecting member (e.g., C-clip) are coupled at a side surface, the metal case 500 may include a conductive metallic member extending from the metal case 500 in a partial area. One side surface of the capacitor and the connecting member connected to the capacitor may be coupled to the metal case through the metallic member. The metallic member is an internal element of the metal case 500 and hereinafter, is thus referred to simply as the metal case 500.

The other side surface of the capacitor and the connecting member connected to the capacitor may be coupled to the PCB 520 including a ground terminal on the PCB. The connecting member and the capacitor coupled to the connecting member may be disposed between the PCB 520 and the metal case 500. A portion or an entire one side surface of the connecting member may contact the metal case, and a portion or an entire other side surface thereof may be coupled to the capacitor. The capacitor may be coupled to the lower surface or end of the connecting member, may be coupled to the connecting member using a bonding member, or may be coupled to the side surface A of the connecting member as described above. A portion or an entire one side surface of the capacitor may be coupled to the connecting member, and a portion or an entire other side surface thereof may be coupled to the PCB 520 including the ground terminal.

The connecting member may be a C-clip or an SMD gasket within a conductive material but is not limited thereto, and may entirely include a conductive material.

As shown in an enlarged illustration 550 of the connecting member and the capacitor coupled to the connecting member, the capacitor is coupled to the side surface A of the connecting member. A portion or an entire opposite side surface of the capacitor may be connected to the PCB 520 having the ground terminal, and a current may flow from the case 500 to the ground terminal of the PCB 520 through the capacitor as configured by the number and arrangement of internal electrodes and dielectric of the capacitor.

Figure 6:
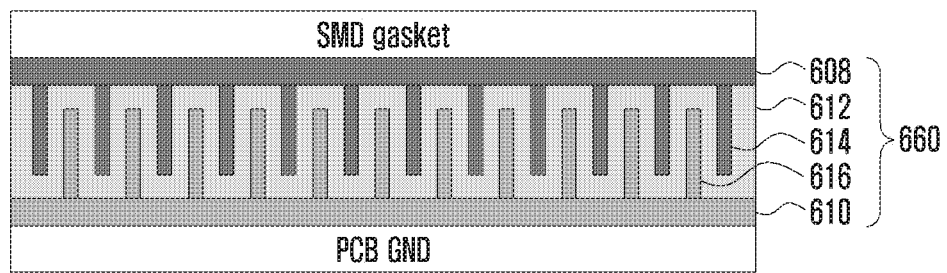
FIGS. 6 to 9 are cross-sectional views illustrating an example of a coupling structure of a capacitor according to an embodiment of the present disclosure.

FIG. 6 is a cross-sectional view illustrating an example of a coupling structure of a capacitor according to an embodiment of the present disclosure.

Referring to FIG. 6, a capacitor 660 includes two physically insulated conductive materials and a dielectric layer 612 formed between the two conductive materials. The conductive material may be a first external electrode 608 and a second external electrode 610. The first external electrode 608 and the second external electrode 610 include first internal electrodes 614 joined together by the first external electrode 608, and second internal electrodes 616 joined together by the second external electrode 610, respectively, arranged in an interdigitated manner. The first internal electrode 614 and the second internal electrode 616 may be a conductive material.

A portion or an entire one side surface of the first external electrode 608 of the capacitor 660 may be connected to an SMD gasket within a conductive material, and a portion or an entire other side surface of the second external electrode 610 of the capacitor 660 may be connected to a PCB including a ground terminal. According to another embodiment of the present disclosure, a portion or an entire first external electrode 608 existing at one side surface of the capacitor 660 may be integrally formed with an SMD gasket within a conductive material, and a portion or an entire second external electrode 610 existing at the other side surface thereof may be connected to a PCB. A current may be grounded through a ground terminal of the PCB. The capacitor 660 may be the same as the capacitor of FIGS. 2 and 3.

One side surface of the SMD gasket may be connected to the first external electrode 608 of the capacitor 660, and the other side surface of the SMD gasket may contact a metal case. The SMD gasket may include a conductive material having elasticity such that the SMD can be biased in a direction resulting in continuous electrical contact with a metal case of an assembled device. The SMD gasket may have shapes "—" and "∩". As the SMD gasket has elasticity, a partial area or an entire area of the SMD gasket may always maintain a connection to the metal case.

Figure 7:
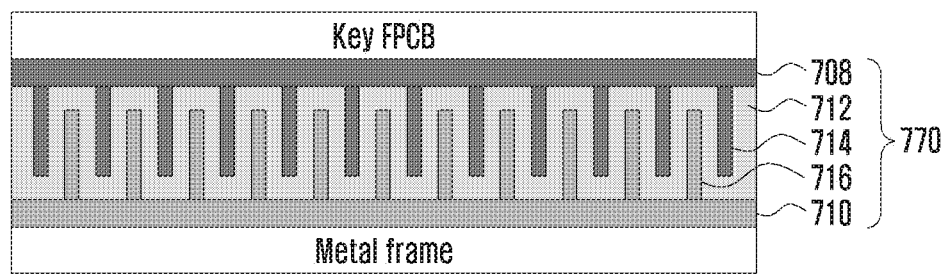

FIG. 7 is also a cross-sectional view illustrating an example of a coupling structure of a capacitor according to various embodiments of the present disclosure.

Figure 8:
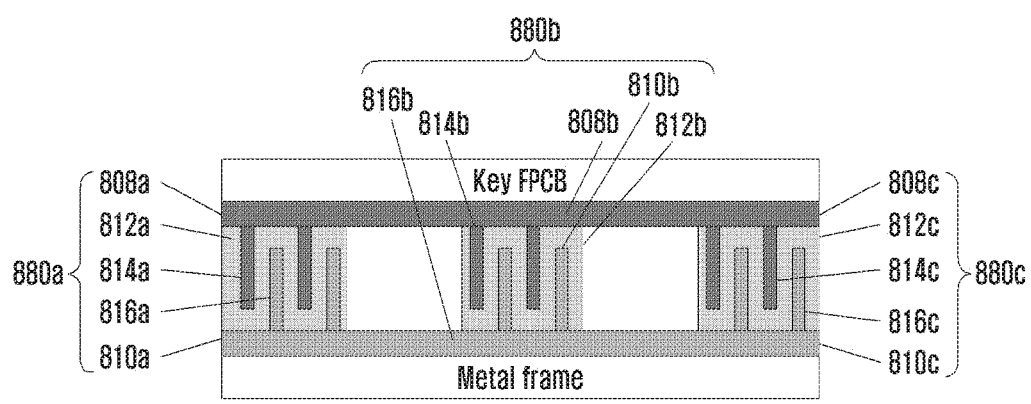
Figure 9:
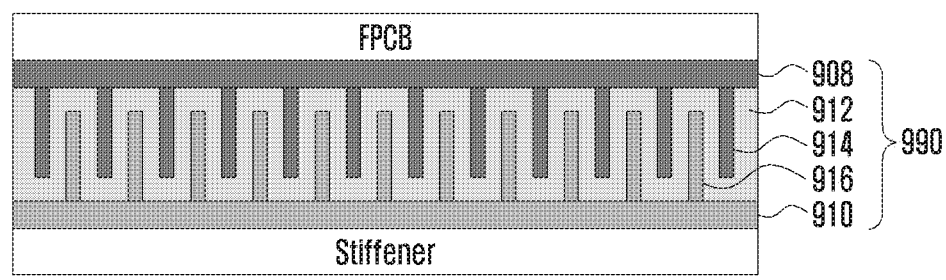

FIGS. 7 to 9 are cross-sectional views illustrating an example in which a capacitor is coupled to another element to be used in addition to the capacitor coupled to a metal case.

Referring to FIG. 7, a capacitor 770 includes two physically insulated conductive materials and a dielectric layer 712 formed between the two conductive materials. The conductive material may be a first external electrode 708 and a second external electrode 710. The first external electrode 708 and the second external electrode 710 include first internal electrodes 714 joined together by the first external electrode 708, and second internal electrodes 716 joined together by the second external electrode 710, respectively, arranged in an interdigitated manner. The first internal electrode 714 and the second internal electrode 716 may be a conductive material.

A partial area or an entire area of the first external electrode 708 of one side surface of the capacitor 770 may be connected to a key flexible PCB (FPCB), and a portion or an entire side of the second external electrode 710 of the other side surface of the capacitor 770 may be connected to a metal frame (e.g., bracket). The key FPCB may be an element constituting a specific key (e.g., a home key, power key, volume key and the like).

In an embodiment of the present disclosure, the metal frame connected to the second external electrode 710 may be connected to a PCB. A current may be grounded through the metal frame.

In an embodiment of the present disclosure, the key FPCB connected to the first external electrode 708 may be connected to the PCB. The PCB may include a ground terminal.

The key FPCB and the metal frame may be made of metal or other conductive material.

The capacitor 770 may be the same as the capacitor 220 of FIG. 2. Accordingly, the key FPCB may be electrically connected to the first external electrode 708, and the metal frame may be electrically connected to the second external electrode 710.

In an embodiment of the present disclosure, one side surface of the metal frame may replace an external electrode (e.g., the second external electrode 710) of the capacitor. Further, one side surface of the key FPCB may replace an external electrode (e.g., the first external electrode 708) of the capacitor 770. In this case, the capacitor 770 may be the same as the capacitor 330 of FIG. 3.

FIG. 8 is also a cross-sectional view illustrating an example of a coupling structure of a capacitor according to various embodiments of the present disclosure.

Referring to FIG. 8, when a plurality of specific keys exist, a plurality of capacitors 880a, 880b, and 880c may be formed. Although three capacitors are shown, embodiments are not limited thereto.

Respective capacitors 880a, 880b, and 880c may have a property of a separate capacitor. For example, the respective capacitors 880a, 880b, and 880c may have the same or different capacitance values or features.

The respective capacitors 880a, 880b, and 880c may be formed to correspond the capacitors of FIGS. 2 and 3.

The capacitor 880a may include a first external electrode 808a, a second external electrode 810a, a first internal electrode 814a having one side end portion connected to the first external electrode 808a, a second internal electrode 816a having one side end portion connected to the second external electrode 810a, and a dielectric layer 812a. That is, capacitor 880a of FIG. 8 includes two physically insulated conductive materials and the dielectric layer 812a formed between the two conductive materials. The conductive material may be the first external electrode 808a and the second external electrode 810a. The first external electrode 808a and the second external electrode 810a include the first internal electrodes 814a joined together by the first external electrode 808a, and the second internal electrodes 816a joined together by the second external electrode 810a, respectively, arranged in an interdigitated manner. The first internal electrodes 814a and the second internal electrodes 816a may be a conductive material.

The capacitor 880b may include a first external electrode 808b, a second external electrode 810b, a first internal electrode 814b having one side end portion connected to the first external electrode 808b, a second internal electrode 816b having one side end portion connected to the second external electrode 810b, and a dielectric layer 812b. That is, capacitor 880b of FIG. 8 also includes two physically insulated conductive materials and the dielectric layer 812b formed between the two conductive materials. The conductive material may be the first external electrode 808b and the second external electrode 810b. The first external electrode 808b and the second external electrode 810b include the first internal electrodes 814b joined together by the first external electrode 808b, and the second internal electrodes 816b joined together by the second external electrode 810b, respectively, arranged in an interdigitated manner. The first internal electrodes 814b and the second internal electrodes 816b may be a conductive material.

The capacitor 880c may include a first external electrode 808c, a second external electrode 810c, a first internal electrode 814c having one side end portion connected to the first external electrode 808c, a second internal electrode 816c having one side end portion connected to the second external electrode 810c, and a dielectric layer 812c. That is, capacitor 880c of FIG. 8 also includes two physically insulated conductive materials and the dielectric layer 812c formed between the two conductive materials. The conductive material may be the first external electrode 808c and the second external electrode 810c. The first external electrode 808c and the second external electrode 810c include the first internal electrodes 814c joined together by the first external electrode 808c, and the second internal electrodes 816c joined together by the second external electrode 810c, respectively, arranged in an interdigitated manner. The first internal electrodes 814c and the second internal electrodes 816c may be a conductive material.

The capacitors 880a, 880b and 880c may be the same as the capacitor 220 of FIG. 2. Accordingly, the key FPCB may be electrically connected to the first external electrodes 808a, 808b and 808c, and the metal frame may be electrically connected to the second external electrodes 810a, 810b and 810c. In an embodiment of the present disclosure, a partial area or an entire area of the first external electrodes 808a, 808b and 808c, of one side surface of the capacitors may be connected to the key flexible PCB (FPCB), and a portion or an entire side of the second external electrodes 810a, 810b and 810c, of the other side surface of the capacitors may be connected to the metal frame (e.g., bracket). The key FPCB may be an element constituting a specific key (e.g., a home key, power key, volume key and the like).

In an embodiment of the present disclosure, one side surface of the metal frame may replace an external electrode (e.g., the second external electrodes 810a, 810b and 810c) of the capacitor. Further, one side surface of the key FPCB may replace an external electrode (e.g., the first external electrodes 808a, 808b and 808c). In this case, the capacitors 880a, 880b and 880c may be the same as the capacitor 330 of FIG. 3.

FIG. 9 is also a cross-sectional view illustrating an example of a coupling structure of a capacitor according to various embodiments of the present disclosure.

Referring to FIG. 9, a capacitor 990 includes two physically insulated conductive materials and a dielectric layer 912 formed between the two conductive materials. The conductive material may be a first external electrode 908 and a second external electrode 910. The first external electrode 908 and the second external electrode 910 include first internal electrodes 914 joined together by the first external electrode 908, and second internal electrodes 916 joined together by the second external electrode 910, respectively, arranged in an interdigitated manner. The first internal electrodes 914 and the second internal electrodes 916 may be a conductive material.

A portion or an entire first external electrode 908 of one side surface of the capacitor 990 may be connected to an FPCB, and a portion or an entire second external electrode 910 of the other side surface of the capacitor 990 may be connected to a stiffener. The FPCB and the stiffener may be a conductive material. For example, the FPCB may be an element requiring a stiffener on the PCB.

In an embodiment of the present disclosure, a display or a camera may connect physical elements existing within the electronic device through the FPCB. When connecting elements through a connector such as the FPCB, the display or the camera may include a stiffener for reinforcing a connection of the connector. The capacitor 990 may be disposed between the connector and the stiffener. According to an embodiment, a partial area or an entire area of the first external electrode 908 of the capacitor 990 may be connected to a partial area or an entire area of one side surface of the FPBC, and a partial area or an entire area of the second external electrode 910 of the capacitor 990 may be connected to a stiffener that reinforces connection. As the stiffener is connected to the PCB, a current may be grounded to a PCB including a ground terminal through the stiffener.

In an embodiment of the present disclosure, one side surface of the FPCB may be connected to the PCB, and the other side surface thereof may be connected to the capacitor 990. A current may be grounded to the FPCB.

In an embodiment of the present disclosure, one side surface of the stiffener may replace an external electrode (e.g., a second external electrode 910) of the capacitor 990. Further, one side surface of the FPCB may replace an external electrode (e.g., a first external electrode 908) of the capacitor 990. In this case, the capacitor 990 may be the same as the capacitor 330 of FIG. 3

As described above, an electronic device according to various embodiments of the present disclosure can prevent an electric shock from occurring through coupling of a capacitor and effectively use space of an upper portion or surface of a PCB therein.

Further, an electronic device according to various embodiments of the present disclosure can stabilize an RF performance through coupling of a capacitor.

While the present disclosure has been shown and described with reference to various embodiments thereof, it will be understood by those skilled in the art that various changes in form and detail may be made therein without departing from the spirit and scope of the present disclosure as defined by the appended claims and their equivalents.

DESCRIPTION OF SYMBOLS

200: connecting member
202: contact portion of connecting member 200
204: bending portion of connecting member 200
206: support portion of connecting member 200
208: first external electrode of capacitor 220
210: second external electrode of capacitor 220
212: dielectric layer of capacitor 220
214: first internal electrode of capacitor 220
216: second internal electrode of capacitor 220
220: capacitor

What is claimed is:

1. An electronic device, comprising:
   a housing comprising a metal material portion;
   a first conductive member that contacts at least a portion of the metal material portion, or that is formed by the metal material portion;
   a second conductive member separated from the first conductive member, wherein at least a portion of the second conductive member is electrically connected to a ground; and
   a capacitor disposed between the first conductive member and the second conductive member,
   wherein the capacitor is configured to conduct a current from the metal material portion of the housing to the ground.

2. The electronic device of claim 1,
   wherein the first conductive member is a flexible printed circuit board (FPCB), and
   wherein the second conductive member is a stiffener.

3. The electronic device of claim 1,
   wherein the first conductive member is a key flexible printed circuit board (FPCB), and
   wherein the second conductive member is a metallic member.

4. The electronic device of claim 3, wherein the capacitor is formed to be implemented as a separate capacitor for each key.

5. The electronic device of claim 4, wherein the key FPCB is formed for at least one of a volume key, a power key, or a home key.

6. The electronic device of claim 1, wherein the capacitor comprises a bonding member to connect to the second conductive member.

7. The electronic device of claim 1, wherein the second conductive member contacts the capacitor or is formed as a portion of the capacitor.

* * * * *